(12) United States Patent
Ki

(10) Patent No.: US 7,745,823 B2
(45) Date of Patent: Jun. 29, 2010

(54) THIN FILM PANEL AND METHOD OF MANUFACTURING THE SAME

(75) Inventor: Dong-Hyeon Ki, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 11/479,233

(22) Filed: Jun. 30, 2006

(65) Prior Publication Data
US 2007/0001947 A1    Jan. 4, 2007

(30) Foreign Application Priority Data
Jul. 1, 2005    (KR) .................. 10-2005-0059092

(51) Int. Cl.
*H01L 31/00* (2006.01)
(52) U.S. Cl. .............................. 257/59; 257/48; 257/72; 257/E23.011; 257/E23.143; 257/E23.145; 257/E23.179; 257/E21.521; 257/E23.168; 257/E23.169; 257/E21.524; 257/E23.17; 257/E27.1; 257/E27.116; 349/139; 349/143; 349/149; 349/192; 349/54

(58) Field of Classification Search ........................ None
See application file for complete search history.

(56) References Cited

U.S. PATENT DOCUMENTS

| | | | | |
|---|---|---|---|---|
| 5,473,261 | A * | 12/1995 | Marumoto et al. | 324/770 |
| 6,287,899 | B1 * | 9/2001 | Park et al. | 438/149 |
| 6,404,473 | B1 * | 6/2002 | Kaneko et al. | 349/139 |
| 2004/0022044 | A1 * | 2/2004 | Yasuoka et al. | 361/801 |
| 2004/0095549 | A1 * | 5/2004 | Moon | 349/192 |
| 2004/0119925 | A1 * | 6/2004 | Moon | 349/139 |
| 2005/0092995 | A1 * | 5/2005 | Yoo et al. | 257/72 |

* cited by examiner

*Primary Examiner*—Minh-Loan T Tran
*Assistant Examiner*—Fei Fei Yeung Lopez
(74) *Attorney, Agent, or Firm*—Innovation Counsel LLP

(57) ABSTRACT

A thin film panel is provided, which includes a first signal line and a second signal line crossing the first signal line and formed on a different layer from the first signal line. The second signal line includes an expansion having an enlarged area and at least one cutout, and is disposed adjacent to a crossing region where the second signal line crosses the first signal line.

19 Claims, 17 Drawing Sheets

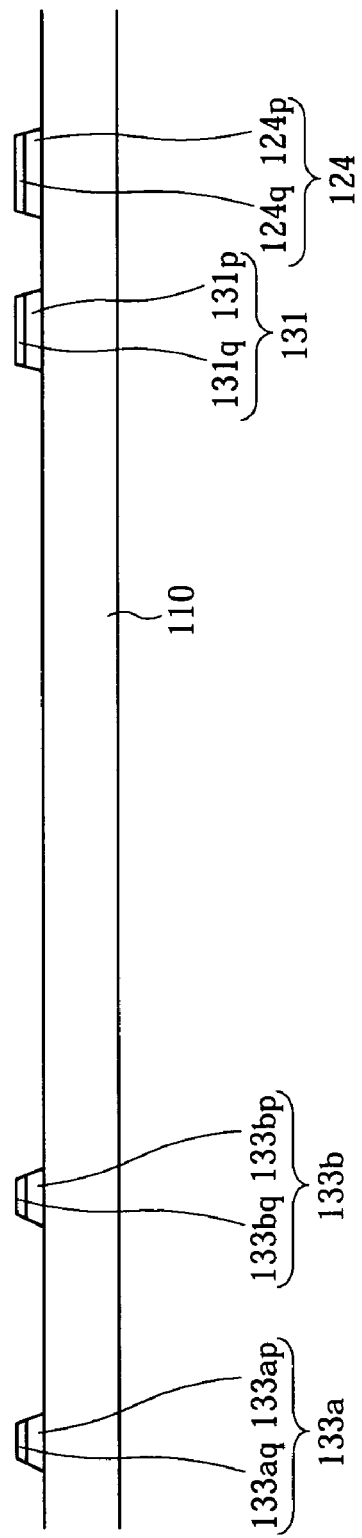

THIN FILM PANEL AND METHOD OF MANUFACTURING THE SAME

CROSS-REFERENCE TO RELATED APPLICATIONS

This application claims priority from Korean Patent Application No. 10-2005-0059092 filed in the Korean patent office on Jul. 1, 2005, which is hereby incorporated by reference in its entirety.

BACKGROUND OF THE INVENTION (a) Field of the Invention

The present invention relates to a thin film panel and a method of manufacturing the same.

(b) Description of the Related Art

A thin film panel is the most widely used panel type for flat panel displays such as liquid crystal displays (LCDs) and organic light emitting diode (OLED) displays, because of its light weight and thinness.

The thin film panel provides a plurality of pixel electrodes arranged in a matrix, and the image display of the panel is accomplished by applying individual voltages to the respective pixel electrodes. For the application of the individual voltages, a plurality of three-terminal thin film transistors (TFTs) are connected to the respective pixel electrodes. Signals are provided using a plurality of gate lines to transmit signals to control the TFTs and a plurality of data lines to transmit voltages to be applied to the pixel electrodes. The gate lines and the data lines are provided on the panel.

OLED displays are devices that display characters or images by applying an electrode current to an organic emitting diode, at which the pixel electrode is disposed. LCDs are devices that display images by applying an electric field to a liquid crystal layer disposed between two panels and thus by regulating the strength of the electric field to adjust the transmittance of light passing through the liquid crystal layer.

When the display signal lines are disconnected in the process of manufacturing the display device, the disconnection is detected via predetermined tests. Such tests include an array test, a visual inspection (VI) test, a gross test, a module test, and so on.

The array test is used to detect the disconnection of the display signal lines by applying predetermined voltages and sensing whether output voltages are generated or not, and is performed before a mother glass is divided into separate cells. The VI test is used to detect the disconnection of the display signal lines by applying predetermined voltages and then viewing the panels, and is performed after the mother glass is divided into separate cells. The gross test is used to determine the image quality and connection status of the display signal lines by applying predetermined voltages and viewing display states of a screen, and is performed before mounting driving circuits thereon. Typically, the predetermined voltages are applied after combining a lower panel and an upper panel of the flat panel display. The module test is used to determine the optimum operation of the driving circuits, and is performed after mounting the driving circuits thereon.

However, when the predetermined voltage is applied for the array test, if disconnections of signal lines such as the data lines, the gate lines, and the test lines are generated due to the manufacturing method, the array test is abnormally executed. Accordingly, the resulting array test may not be sufficiently stable and reliable. In some cases, the resistance of certain structures may be increased due to undercuts, and application of the predetermined voltage may lead to signal line disconnection due to excessive resistive heating. When the test lines disconnect during the array test due to melting or other heat-related damage, the results of the array test are unreliable.

A motivation of the present invention is to provide a thin film transistor array and a method for manufacturing the same to achieve stable and reliable array testing.

SUMMARY OF THE INVENTION

A thin film panel is provided, which includes a first signal line and a second signal line crossing the first signal line and formed on a different layer from the first signal line. The second signal line includes an expansion having an enlarged area and at least one cutout, and is disposed adjacent to a crossing region where the second signal line crosses the first signal line.

The thin film panel may further include a connecting assistant formed adjacent to the crossing region, and a first insulating layer formed between the first signal line and the second signal line and a second insulating layer formed on the second signal line. The first and second signal lines may include a first layer and a second layer formed on the first layer.

The second insulating layer may have at least one first contact hole exposing a portion of the expansion. The first and second insulating layers may have a second contact hole exposing a portion of the first signal line, and the connector assistant electrically connects the first signal line to the second signal line through the first and second contact holes.

The expansion exposed through the first contact hole may comprise the material of the first layer, and the first insulating layer may be exposed through the cutout.

The first layer of the first and second signal lines may comprise chromium or a chromium alloy, and the second layer of the first and second signal lines may comprise aluminum or an aluminum alloy. The first signal line may include a third signal line and a fourth signal line, and the third and the fourth signal lines are connected to the second signal line in turn.

The thin film panel may further include a shorting bar connected to the second signal line, a gate line for transmitting a gate signal, and a data line for transmitting a data signal. The gate line and the data line are in the same layer as the first signal lines and the second signal lines, respectively.

A method for manufacturing a thin film panel is provided, which includes forming a first signal line on a substrate, forming a first insulating layer covering the first signal line, depositing a conductive layer on the first insulating layer, and patterning the conductive layer to form a second signal line including an expansion having an enlarged area and disposed adjacent to a crossing region where the second signal line crosses the first signal line. The expansion may have at least one cutout.

The method may further include depositing a second insulating layer covering the second signal line, and patterning the second insulating layer to form at least one contact hole exposing a portion (some or all) of the expansion.

The first and second signal lines may include a first layer and a second layer formed in the first layer, and the expansion disposed at the contact hole may be made of the first layer.

The first insulating layer may be exposed through the cutout.

The first layer of the first and second signal lines may comprise chromium or a chromium alloy, and the second layer of the first and second signal lines may comprise aluminum or an aluminum alloy.

The method may further include a shorting bar connected to the second signal line.

BRIEF DESCRIPTION OF THE DRAWINGS

The above and other advantages of the present invention will become more apparent by describing preferred embodiments thereof in detail with reference to the accompanying drawings, in which:

FIGS. 6A, 6B, and 6C are sectional views of the TFT array panel shown in FIG. 5 taken along the lines VIA-VIA, VIB-VIB, and VIC-VIC;

DETAILED DESCRIPTION OF EMBODIMENTS

Figure 1:
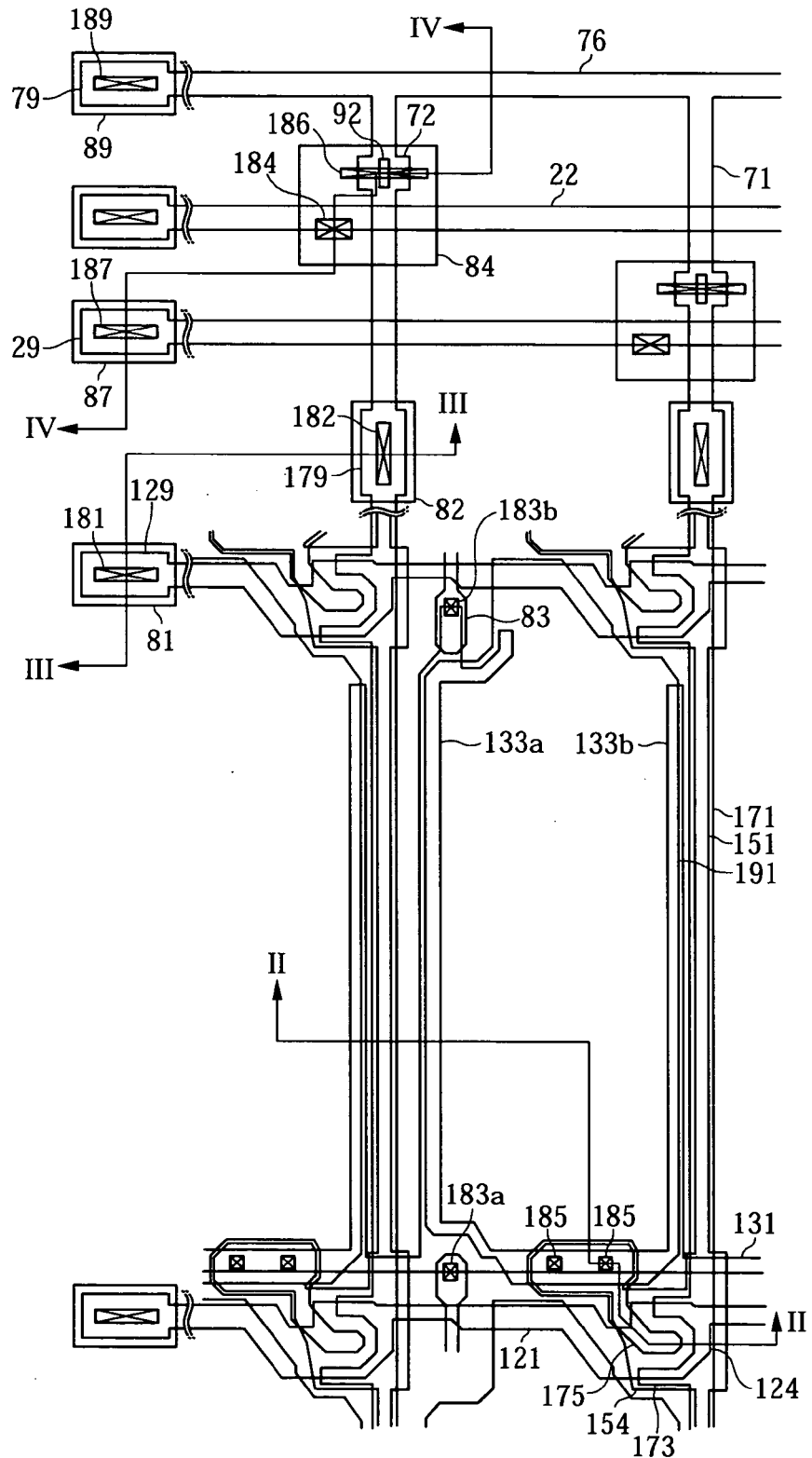
FIG. 1 is an exemplary layout view of a TFT array panel for a liquid crystal display according to an embodiment of the present invention.

The present invention will now be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A TFT array panel and a method for manufacturing the same according to an embodiment of the present invention will be described in detail with reference to FIGS. 1-5.

Figure 2:
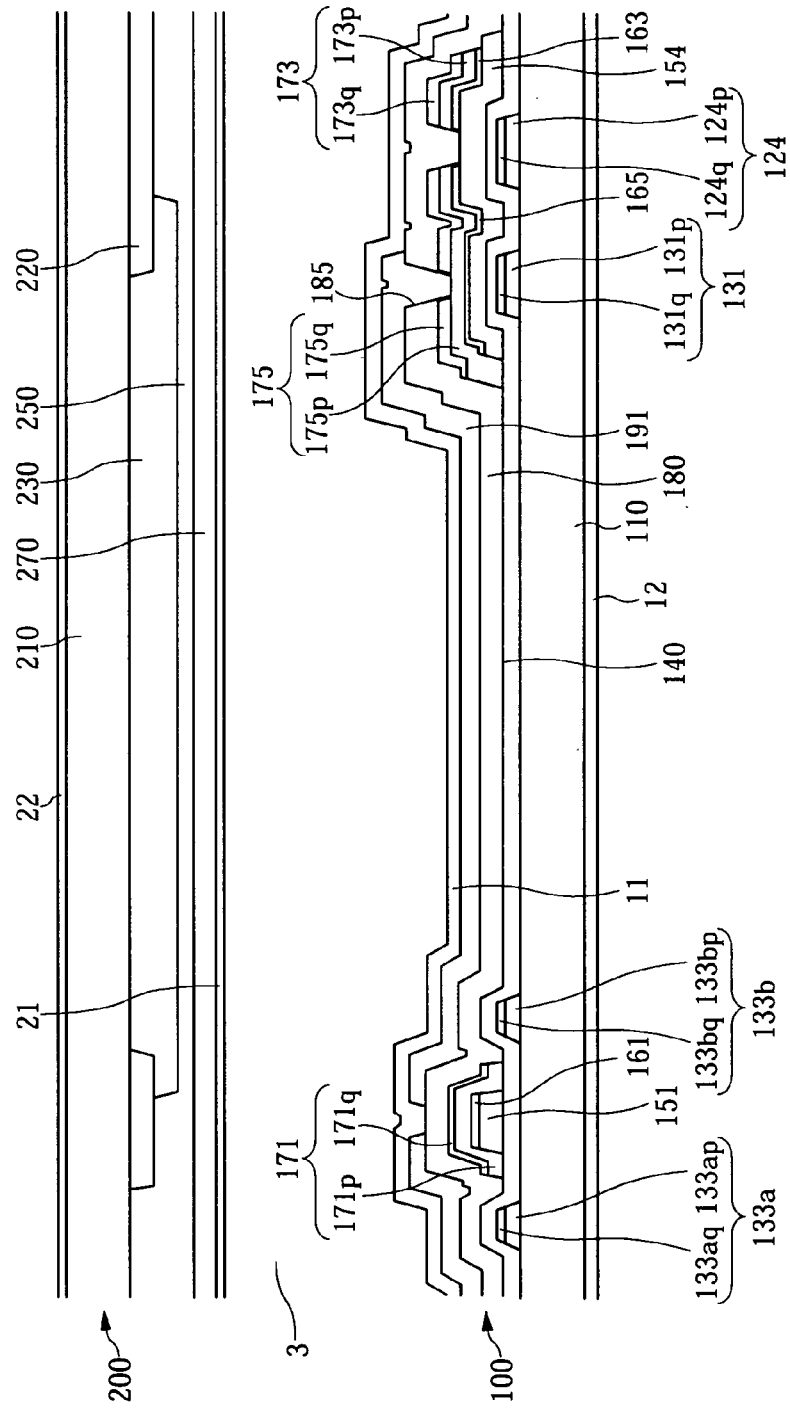
FIGS. 2, 3, and 4 are sectional views of an LCD including the TFT array panel shown in FIG. 1 and a color filter panel, taken along the lines II-II, III-II, and IV-IV, respectively.
Figure 3:
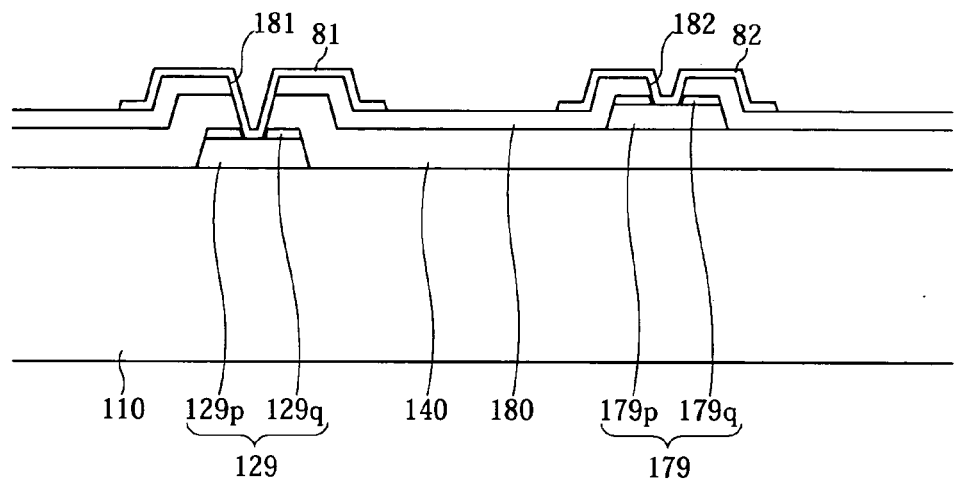
Figure 4:
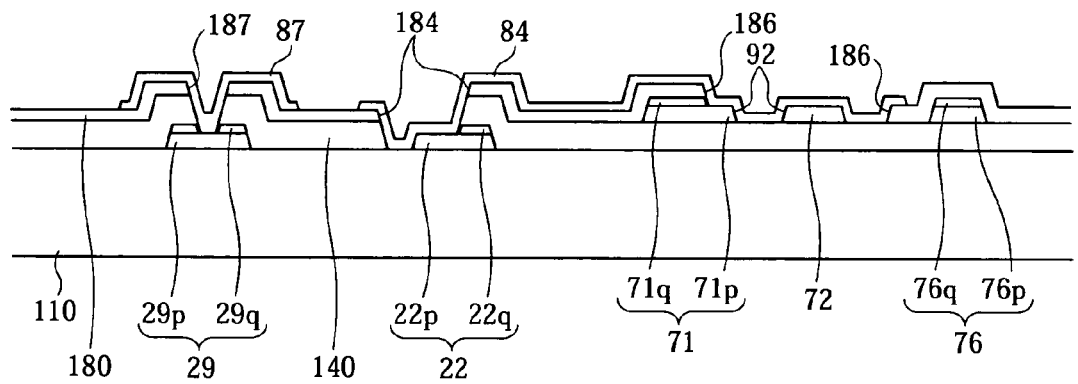

FIG. 1 is a layout view of a TFT array panel for an LCD according to an embodiment of the present invention, FIGS. 2, 3, and 4 are sectional views of the LCD including the TFT array panel shown in FIG. 1 and a color filter panel, taken along the lines II-II, III-III, and IV-IV.

An LCD according to an embodiment of the present invention includes a TFT array panel 100, a color filter panel 200 opposite to the TFT array panel 100, and an LC layer 3 having LC molecules that is disposed between the two panels 100 and 200.

First, a TFT array panel 100 according to an embodiment of the present invention will be described in detail with reference to FIGS. 1 to 4.

A plurality of gate lines 121, a plurality of storage electrode lines 131, and a plurality of first test lines 22 are formed on an insulating substrate 110 made of a material such as transparent glass or plastic.

The gate lines 121 transmit gate signals and extend substantially in a transverse direction (horizontally in FIG. 1). Each of the gate lines 121 includes a plurality of gate electrodes 124 projecting downward and an end portion 129 having a large area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated on the substrate 110. The gate lines 121 may extend to be connected to a driving circuit that may be integrated on the substrate 110.

The storage electrode lines 131 are configured to receive a predetermined voltage, and each of the storage electrode lines 131 includes a stem extending substantially parallel to the gate lines 121 and a plurality of pairs of storage electrodes 133a and 133b branched from the stems. Each of the storage electrode lines 131 is disposed between two adjacent gate lines 121, and a stem is close to one of the two adjacent gate lines 121. Each of the storage electrodes 133a and 133b has a fixed end portion connected to the stem and a free end portion disposed opposite thereto. The fixed end portion of the storage electrode 133b has a large area, and the free end portion thereof is bifurcated into a linear branch and a curved branch. However, the storage electrode lines 131 may have various shapes and arrangements.

The first test lines 22 transmit test signals and extend substantially in a transverse direction. Each of the first test lines 22 includes an end portion 29 having a large area for contact with a test probe.

The gate lines 121, the storage electrode lines 131, and the first test lines 22 are preferably made of an Al-containing metal such as Al or an Al alloy, a Ag-containing metal such as Ag or a Ag alloy, a Cu-containing metal such as Cu or a Cu alloy, a Mo-containing metal such as Mo or a Mo alloy, Cr, Ta, or Ti. However, they may have a multi-layered structure including two conductive films having different physical characteristics (not shown). One of the two films is preferably made of a low resistivity metal such as an Al-containing metal, a Ag-containing metal, and/or a Cu-containing metal for reducing signal delay or voltage drop. The other film is preferably made of a material such as a Mo-containing metal, Cr, Ta, or Ti, which have good physical, chemical, and electrical contact characteristics with other materials such as indium tin oxide (ITO) and indium zinc oxide (IZO). Good examples of the combination of the two films are a lower Cr film and an upper Al (alloy) film. For embodiments in which multiple films are used, it is preferable that a portion of an upper layer 129q of end portion 129 may be removed to expose a portion of the lower layer 129p of the end portion 129.

However, the gate lines 121, the storage electrode lines 131, and the first test lines 22 may include the lower layer made of a low resistivity metal and the upper film made of a metal providing good physical contact. Also, they may have a single layered structure comprising at least one of the above-described materials, and they may be comprise various other metals or conductors.

As shown in FIGS. 2, 3, and 4, the lower layers and the upper layers of the gate electrodes 124, the end portions 129, the storage electrode lines 131, the storage electrodes 133a and 133b, and the first test lines 22 are respectively denoted by adding "p" (lower) and "q" (upper) to the reference numbers of the gate electrodes 124, the end portions 129, the storage electrode lines 131, the storage electrodes 133a and 133b, and the first test lines 22, respectively.

The lateral sides of the gate lines 121, the storage electrode lines 131, and the first test lines 22 are inclined relative to a surface of the substrate 110, and the inclination angle thereof ranges about 30-80 degrees.

A gate insulating layer 140 preferably made of silicon nitride (SiNx) or silicon oxide (SiOx) is formed on the gate lines 121, the storage electrode lines 131, and the first test lines 22.

A plurality of semiconductor stripes 151 preferably made of hydrogenated amorphous silicon (abbreviated to "a-Si") or polysilicon are formed on the gate insulating layer 140. The semiconductor stripes 151 extend substantially in the longitudinal direction (vertically in FIG. 1) and become wide near the gate lines 121 and the storage electrode lines 131, so that the semiconductor stripes 151 cover large areas of the gate lines 121 and the storage electrode lines 131. Each of the semiconductor stripes 151 includes a plurality of projections 154 branched out toward the gate electrodes 124.

A plurality of ohmic contact stripes 161 and ohmic contact islands 165 are formed on the semiconductor stripes 151. The ohmic contact stripes 161 and islands 165 are preferably made of n+ hydrogenated a-Si heavily doped with an N-type impurity such as phosphorous. In some embodiments, they may be made of silicide. Each ohmic contact stripe 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof are preferably in a range of about 30-80 degrees.

A plurality of data lines 171, a plurality of drain electrodes 175, a plurality of second test lines 71, and a shorting bar 76 are formed on the ohmic contacts 161 and 165 and the gate insulating layer 140.

The data lines 171 transmit data signals and extend substantially in the longitudinal direction to cross the gate lines 121. Each data line 171 also crosses the storage electrode lines 131 and runs between adjacent pairs of storage electrodes 133a and 133b. Each data line 171 includes a plurality of source electrodes 173 projecting toward the gate electrodes 124 and being curved like a crescent, and an end portion 179 having a large area for contact with another layer or an external driving circuit. A data driving circuit (not shown) to generate the data signals may be mounted on an FPC film (not shown), which may be attached to the substrate 110, directly mounted on the substrate 110, or integrated on the substrate 110. The data lines 171 may extend to be connected to a driving circuit that may be integrated on the substrate 110.

The second test lines 71 transmit test signals and extend substantially in a longitudinal direction intersecting the first test lines 22. Each of the second test lines 71 includes expansions 72 having a large area for providing a wide current path, like the end portions of the first test lines 22, for contact with a test probe. Each of the expansions includes a cutout 92, and is divided into two portions disposed on both sides with respect to the cutout 92.

The shorting bar 76 transmits test signals, and extends substantially in a transverse direction. The shorting bar 76 is connected to the second test lines 71 and also includes an end portion 79 having a large area. The test signal supplied to the shorting bar 76 is used to test for disconnections and shorts of the display signal lines in an open-short test (OS test), which is executed before the array test.

The drain electrodes 175 are separated from the data lines 171 and disposed opposite the source electrodes 173 with respect to the gate electrodes 124. Each of the drain electrodes 175 includes a wide end portion and a narrow end portion. The wide end portion overlaps a storage electrode line 131 and the narrow end portion is partly enclosed by a source electrode 173 with a "U" shape.

A gate electrode 124, a source electrode 173, and a drain electrode 175 along with a projection 154 of a semiconductor stripe 151 form a TFT. The TFT has a channel formed in the projection 154 disposed between the source electrode 173 and the drain electrode 175.

The data lines 171, the drain electrodes 175, the second test lines 71, and the shorting bar 76 preferably include two conductive films having different physical characteristics, such as lower layers 171p, 175p, 71p, 76p, and upper layers 171q, 175q, 71q, 76q. It is preferable that the upper layers 171q, 175q, 71q, 76q is made of a low resistivity metal such as an Al-containing metal, a Ag-containing metal, and a Cu-containing metal to reduce signal delay or voltage drop, and that the lower layer 171p, 175p, 71p, 76p is made of a refractory metal such as Cr, Mo, Ta, Ti, or alloys thereof. A good example of a double-layered structure includes the lower Cr/Mo (alloy) film and an upper Al (alloy) film.

The data lines 171, the drain electrodes 175, the second test lines 71, and the shorting bar 76 preferably include two conductive films having different physical characteristics, and the upper layer 179q, 175q, 71q of the end portion 179 of the data line 171, the drain electrode 175, and the expansion 72 of the second test line 71 are removed to expose the lower layers 179p, 175p, and 71p thereof. Also, a portion of the upper layer of the expansion 72 is removed and a single layer left in place. However, in some embodiments, the data lines 171, drain electrodes 175, second test lines 71, and the shorting bar 76 may have a single layered structure made of the above-described metal materials and/or other metallic or conductive materials. For example, the data lines 171 and the drain electrodes 175 may be made of various metals or conductors.

As shown in FIGS. 2 and 3, the lower layer and the upper layer of the source electrode 173 are respectively denoted as 173p and 173q.

The data lines 171, the drain electrodes 175, the second test lines 71, and the shorting bar 76 have inclined edge profiles, and the inclination angles thereof range from about 30 degrees to about 80 degrees.

The ohmic contacts 161 and 165 are interposed only between the underlying semiconductor stripes 151 and the overlying data lines 171 and drain electrodes 175 thereon, and reduce the contact resistance therebetween. Although the semiconductor stripes 151 are narrower than the data lines 171 at most places, the width of the semiconductor stripes 151 becomes large near the gate lines 121 and the storage electrode lines 131 as described above, to smooth the profile of the surface, thereby substantially preventing disconnection of the data lines 171. The semiconductor stripes 151 have almost the same planar shapes as the data lines 171 and the drain electrodes 175, as well as the underlying ohmic contacts 161 and 165. However, the semiconductor stripes 151 include some exposed portions which are not covered with the data lines 171 and the drain electrodes 175, such as portions located between the source electrodes 173 and the drain electrodes 175.

A passivation layer 180 is formed on the data lines 171, the drain electrodes 175, the second test lines 71, the shorting bar 76, and the exposed portions of the semiconductor stripes 151. The passivation layer 180 is preferably made of an inorganic or organic insulator, and may have a flat top surface. Examples of inorganic insulator materials that may be used for passivation layer 180 include silicon nitride and silicon oxide. Organic insulator material used for passivation layer 180 may be photosensitive, and may have a dielectric constant of less than about 4.0. The passivation layer 180 may include a lower film of an inorganic insulator and an upper film of an organic insulator such that it has the excellent insulating characteristics of the organic insulator while preventing the exposed portions of the semiconductor stripes 151 from being damaged by the organic insulator.

The passivation layer 180 has a plurality of contact holes 182, 185, 186, and 189 exposing the lower layers 179p, 175p, 71p of the end portions 179 of the data lines 171, the drain electrodes 175 and the expansion portions 72 of the second test lines 71, and the lower layer of the end portion 79 of the shorting bar 76, respectively. The passivation layer 180 and the gate insulating layer 140 have a plurality of contact holes 181 exposing the end portions 129 of the gate lines 121, a plurality of contact holes 183a exposing portions of the storage electrode lines 131 near the fixed end portions of the storage electrodes 133b, a plurality of contact holes 183b exposing the linear branches of the free end portions of the storage electrodes 133b, and a plurality of contact holes 184 and 187 respectively exposing the lower layers 22p and 29p of the portion of the first test lines 22 and the end portion 29.

A plurality of pixel electrodes 191, a plurality of overpasses 83, a plurality of contact assistants 81, 82, 87, and 89, and a plurality of connecting assistants 84 are formed on the passivation layer 180. They are preferably made of a transparent conductor such as ITO or IZO, or a reflective conductor such as Ag, Al, Cr, or alloys thereof.

The pixel electrodes 191 are physically and electrically connected to the drain electrodes 175 through the contact holes 185 such that the pixel electrodes 191 receive data voltages from the drain electrodes 175. Data voltages applied to pixel electrodes 191 generate electric fields in cooperation with a common voltage applied to a common electrode 270 of the opposing color filter panel 200. The local electric field determines the orientations of liquid crystal molecules (not shown) of a liquid crystal layer 3 disposed between the TFT array panel 100 and color filter panel 200. A pixel electrode 191 and the common electrode 270 form a capacitor referred to as a "liquid crystal capacitor," which stores applied voltages after the TFT turns off.

A pixel electrode 191 overlaps a storage electrode line 131 including storage electrodes 133a and 133b. The pixel electrode 191 and a drain electrode 175 connected thereto and the storage electrode line 131 form an additional capacitor referred to as a "storage capacitor," which enhances the voltage storing capacity of the liquid crystal capacitor.

The overpasses 83 cross over the gate lines 121 and they are connected to the exposed portions of the storage electrode lines 131 and the exposed linear branches of the free end portions of the storage electrodes 133b through the contact holes 183a and 183b, respectively, which are disposed opposite each other with respect to the gate lines 121. The storage electrode lines 131 including the storage electrodes 133a and 133b along with the overpasses 83 can be used for repairing defects in the gate lines 121, the data lines 171, or the TFTs.

The contact assistants 81, 82, 87, and 89 are connected to the end portions 129 of the gate lines 121, the end portions 179 of the data lines 171, the end portion 29 of the first test line 22, and the end portion 79 of the shorting bar 71 through the contact holes 181, 182, 187, and 189 respectively. The contact assistants 81, 82, 87, and 89 protect the end portions 129, 179, 29, and 79, and enhance the adhesion between the end portions 129, 179, 29, and 79 and external devices.

The connecting assistant 84 is connected to the first test line 22 and the expansion 72 of the second test line 71, and transmits the test signal of the first test line 22 to the second test line 71.

A description of the color filter panel 200 follows with reference to FIG. 2.

A light shield such as light blocking member 220 (referred to as a black matrix) is formed on an insulating substrate 210 made of a material such as transparent glass or plastic. Light blocking member 220 substantially prevents light leakage. The light blocking member 220 may have a plurality of openings that face the pixel electrodes 191, and it may have substantially the same planar shape as the pixel electrodes 191.

A plurality of color filters 230 are also formed on the substrate 210, and they are disposed substantially in the areas enclosed by the light blocking member 220. The color filters 230 may extend substantially in the longitudinal direction along the pixel electrodes 191. The color filters 230 may represent one of the primary colors such as red, green, and blue colors.

An overcoat 250 is formed on the color filters 230 and the light blocking member 220. The overcoat 250 is preferably made of an (organic) insulator. Overcoat 250 provides a substantially flat surface, and substantially prevents the color filters 230 from being exposed. In some embodiments, the overcoat 250 may be omitted.

A common electrode 270 is formed on the overcoat 250. The common electrode 270 is preferably made of a transparent conductive material such as at least one of ITO and IZO.

Alignment layers 11 and 21 (which may be horizontal or vertical alignment layers) are coated on inner surfaces of the panels 100 and 200. Polarizers 12 and 22 are provided on outer surfaces of the panels 100 and 200. The polarization axes of polarizers 12 and 22 may cross, and one of the polarization axes may be parallel to the gate lines 121. One of the polarizers 12 and 22 may be omitted when the LCD is a reflective LCD.

The LCD may further include at least one retardation film (not shown) to compensate for the retardation of the LC layer 3.

The LCD may further include a backlight unit (not shown) supplying light to the LC layer 3 through the polarizers 12 and 22, the retardation film, and the TFT array panel 100 and color filter panel 200.

A method of manufacturing the TFT array panel shown in FIGS. 1 to 4 according to an embodiment of the present invention will now be described, with reference to FIGS. 5 to 12F.

Figure 6B:
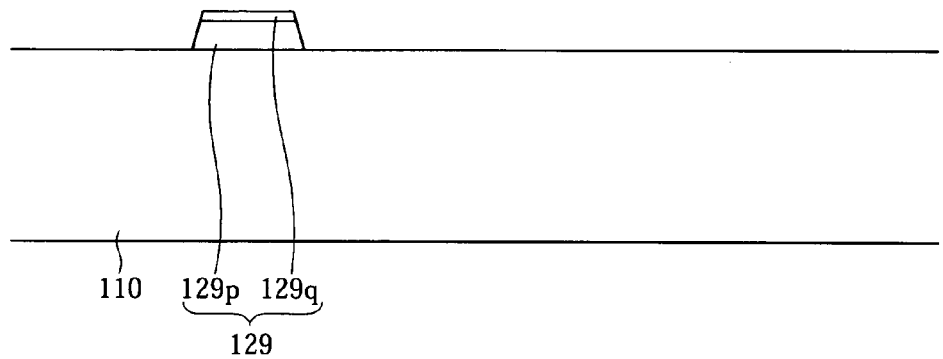
Figure 6C:
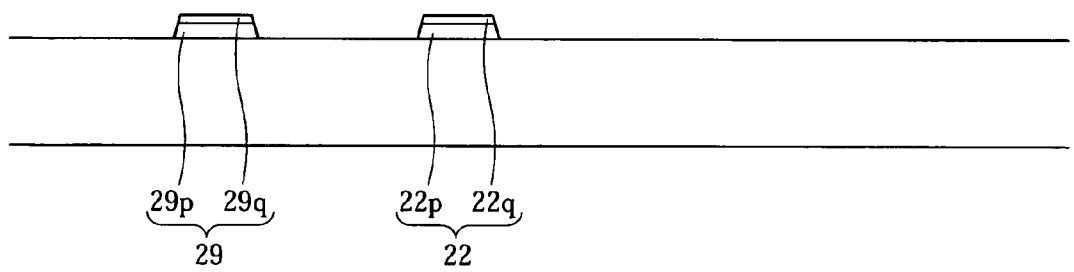
Figure 7:
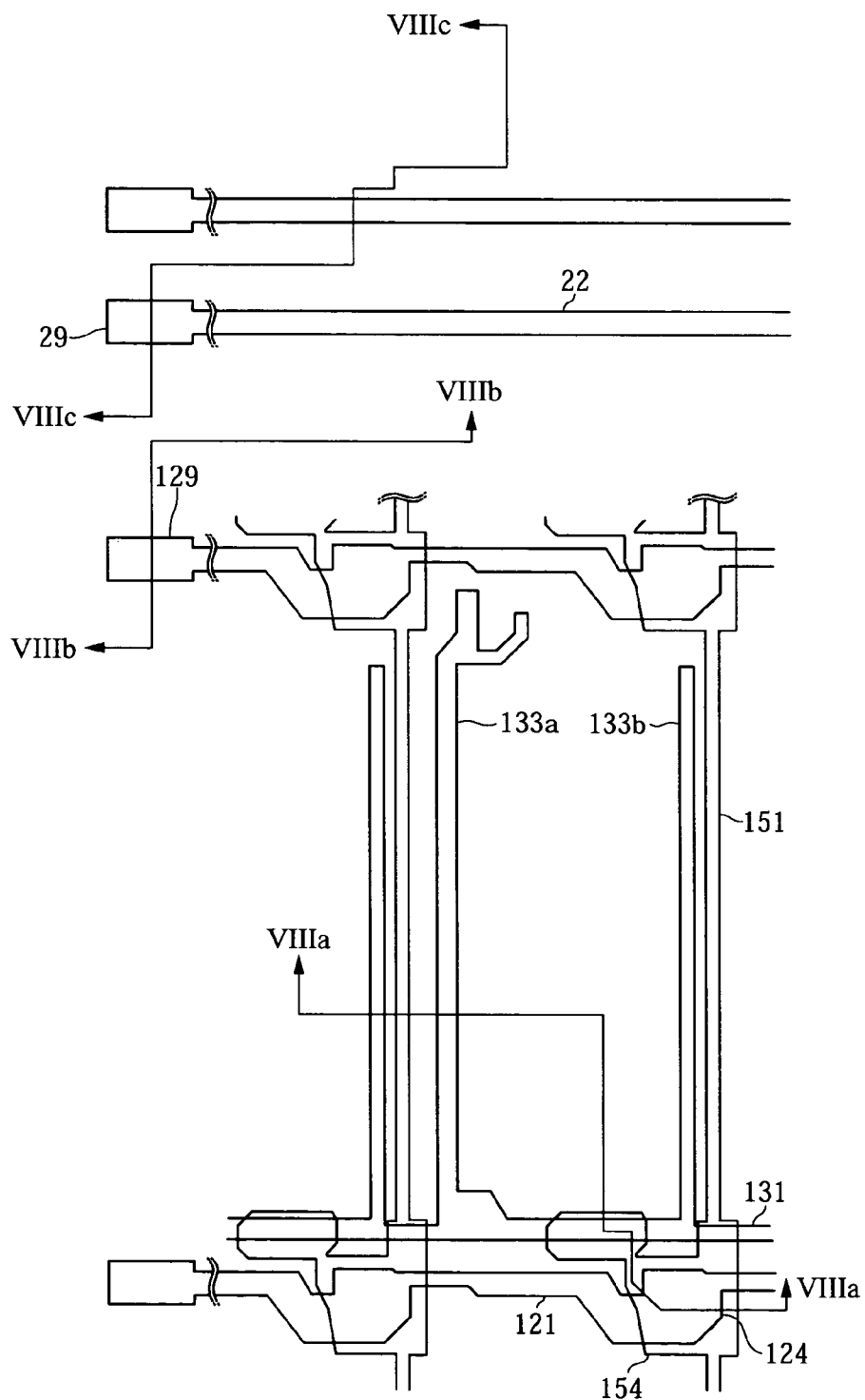
Figure 8A:
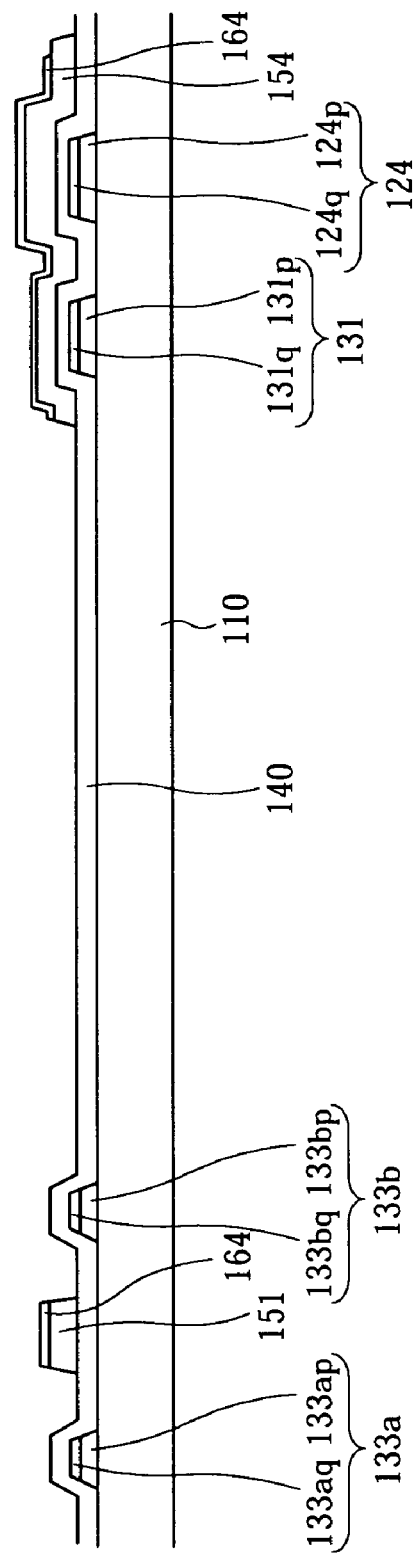
FIGS. 8A, 8B, and 8C are sectional views of the TFT array panel shown in FIG. 7 taken along the lines VIIIA-VIIIA, VIIIB-VIIIB, and VIIIC-VIIIC.
Figure 8B:
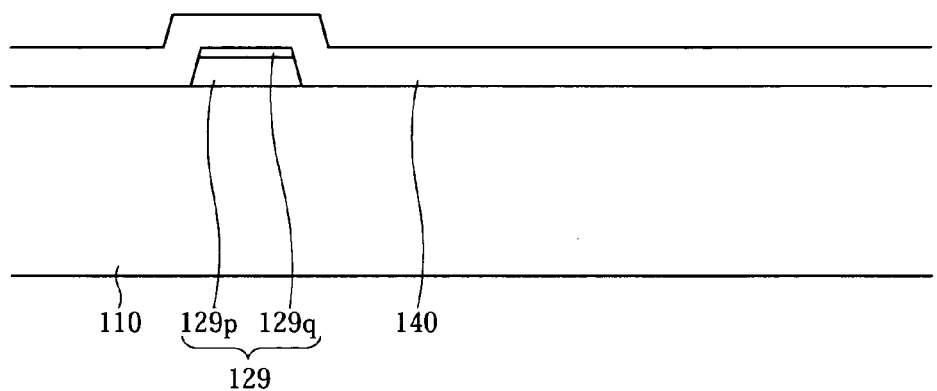
Figure 8C:
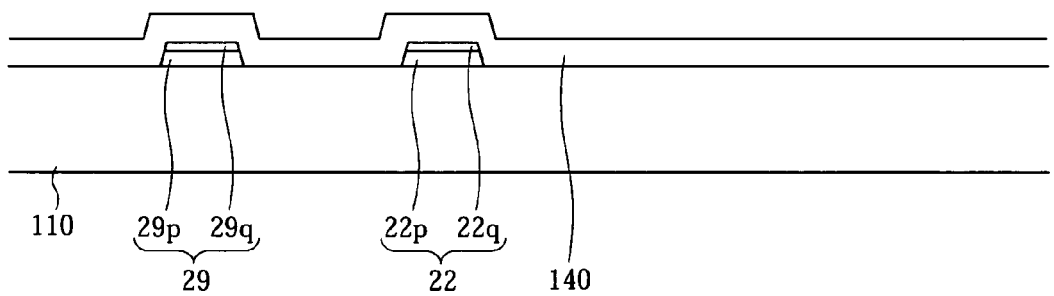
Figure 9:
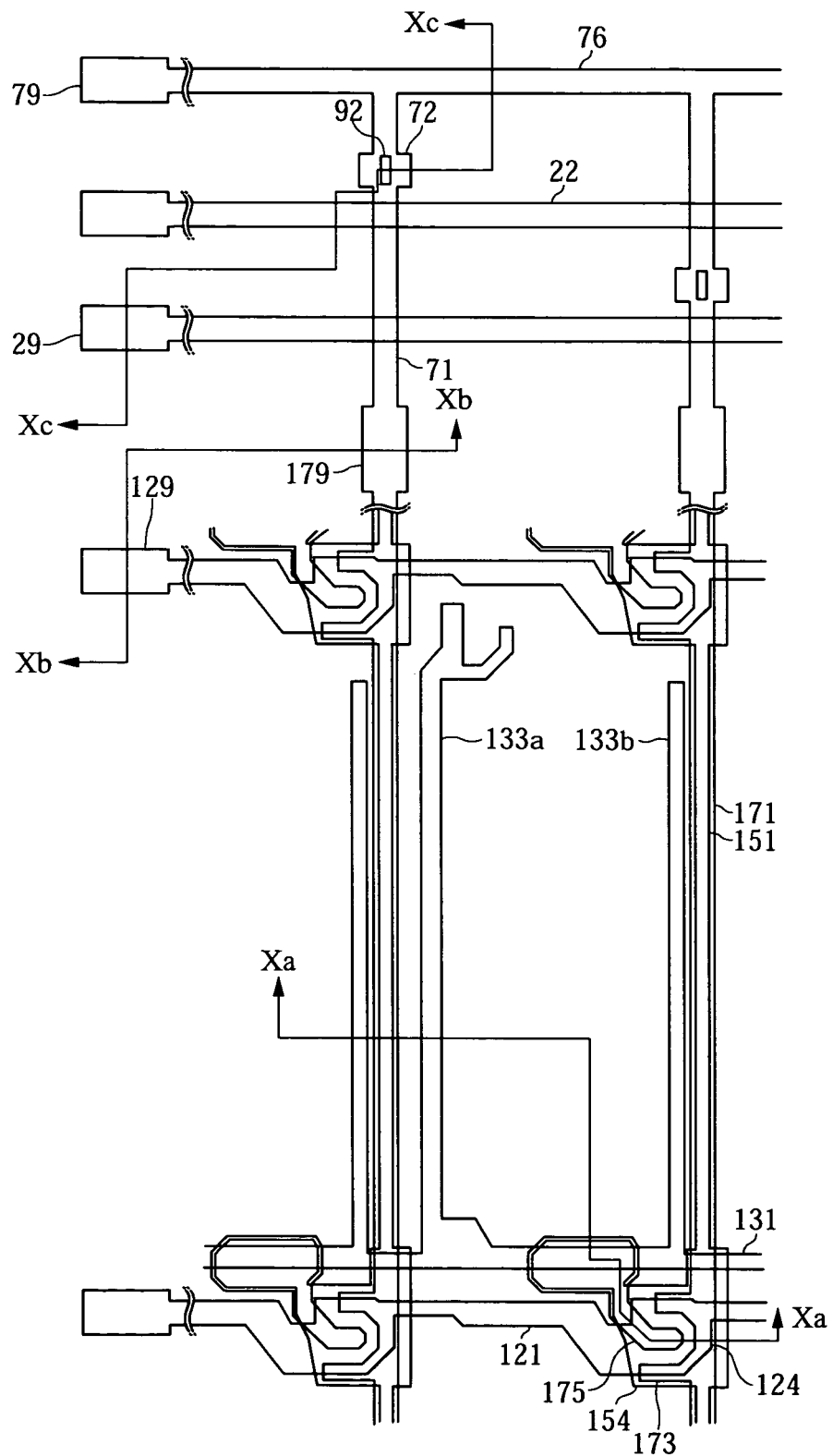
Figure 10A:
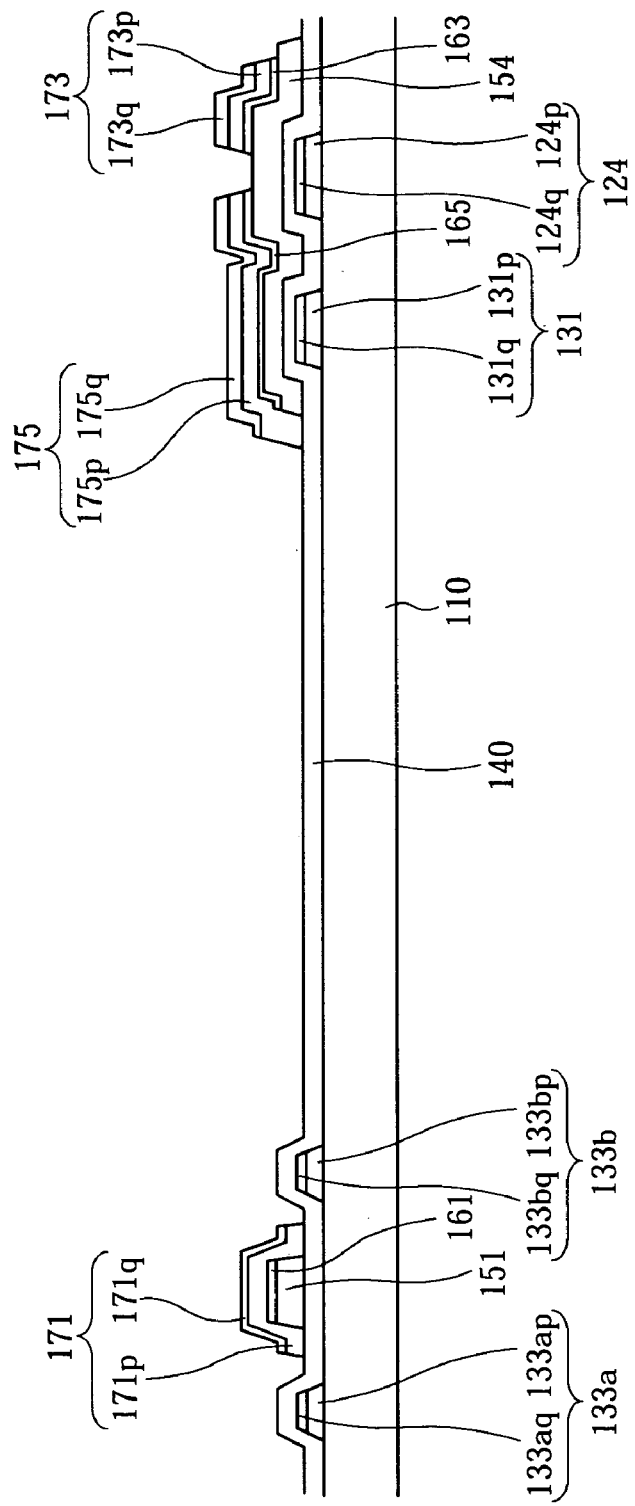
FIGS. 10A, 10B, and 10C are sectional views of the TFT array panel shown in FIG. 9 taken along the lines XA-XA, XB-XB, and XC-XC.
Figure 10B:
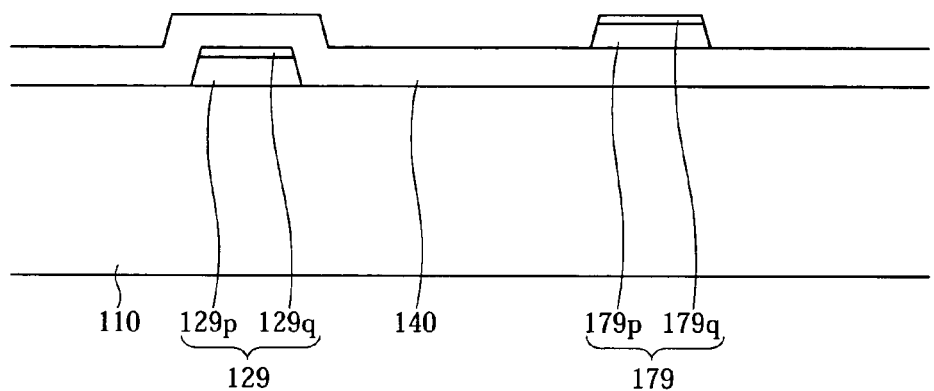
Figure 10C:
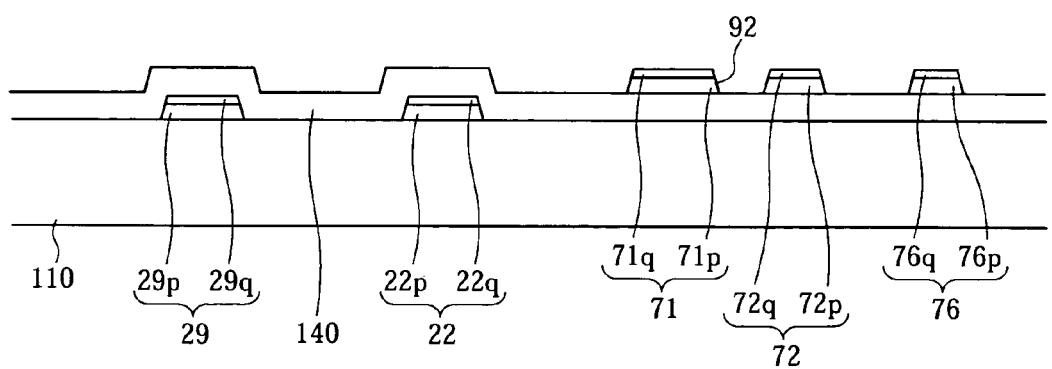

FIGS. 5, 7, 9, and 11 are layout views of a TFT array panel shown in FIGS. 1, 2, 3, and 4 in intermediate steps of a manufacturing method thereof according to an embodiment of the present invention. FIGS. 6A, 6B, and 6C are sectional views of the TFT array panel shown in FIG. 5 taken along the lines VIA-VIA, VIB-VIB, and VIC-VIC. FIGS. 8A, 8B and 8C are sectional views of the TFT array panel shown in FIG. 7 taken along the lines VIIIA-VTIIA, VIIIB-VIIIB, and VIIIC-VIIIC. FIGS. 10A, 10B, and 10C are sectional views of the TFT array panel shown in FIG. 9 taken along the lines XA-XA, XB-XB, and XC-XC. FIGS. 12A and 12B are sectional views of the TFT array panel shown in FIG. 11 taken along the lines XIIA-XIIA and XIIB-XIIB. FIGS. 12C to 12F are sectional views of the TFT array panel shown in FIG. 11 taken along the line XIIC-XIIC in intermediate steps of a manufacturing method thereof, according to an embodiment of the present invention.

Figure 5:
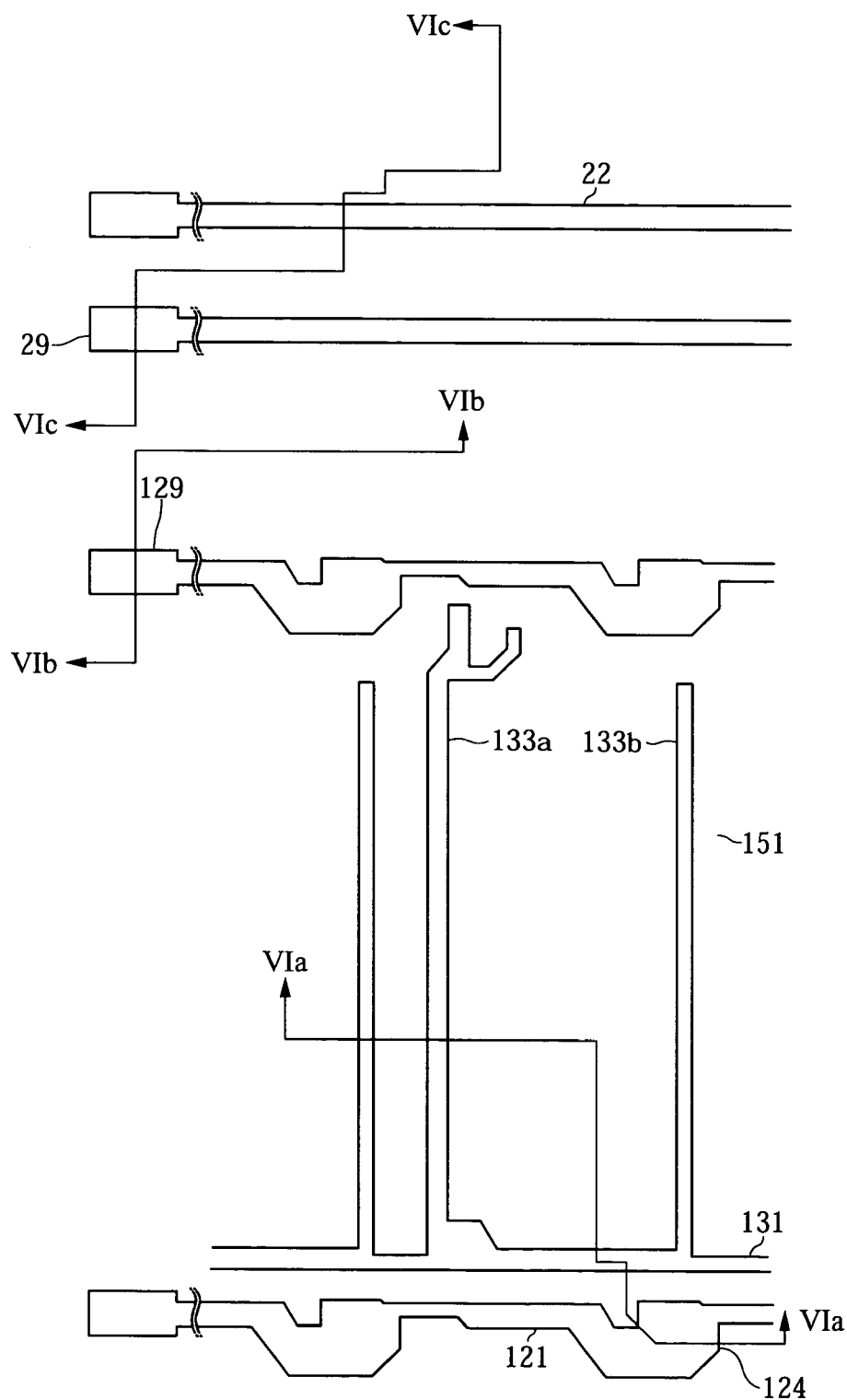
FIGS. 5, 7, 9, and 11 are layout views of a TFT array panel shown in FIGS. 1, 2, 3, and 4 in intermediate steps of a manufacturing method thereof according to an embodiment of the present invention.

As shown in FIGS. 5 to 6C, two metal films including a lower film made of Cr and a upper film made of Al (or an Al alloy) are sequentially sputtered on an insulating substrate 110 made of a material such as transparent glass or plastic. The two metal films are sequentially patterned by wet etching or dry etching with a photoresist pattern to form a plurality of gate lines 121 including a plurality of gate electrodes 124 and an end portion 129, a plurality of storage electrodes 131 having a pair of storage electrodes 133a and 133b, and a first test line 22 including an end portion 29. As shown in FIGS. 6A to 6C, the lower layers and the upper layers of the gate electrodes 124, the end portions 129, the storage electrode lines 131, the storage electrodes 133a and 133b, and the first test lines 22 are respectively denoted by adding "p" (upper) and "q" (lower) to the reference numbers of the gate electrodes 124, the end portions 129, the storage electrode lines 131, the storage electrodes 133a and 133b, and the first test lines 22.

After sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151, including a plurality of projections 154, on the gate insulating layer 140. The gate insulating layer 140 is deposited with a thickness of about 4000 Å to about 5000 Å in a temperature range of about 250 to 500° C., as shown in FIGS. 7 to 8C As shown in FIGS. 9 to 10C, two metal films including a lower film made of Cr and a upper film made of Al (or an Al alloy) are sequentially sputtered on an insulating substrate 110 made of a material such as transparent glass or plastic. The two metal films are sequentially patterned by wet etching or dry etching with a photoresist pattern to form a plurality of data lines 171 including a plurality of source electrodes 173 and an end portion 179, a plurality of drain electrodes 175, a plurality of second test lines 71 including a plurality of extensions 72 having a plurality of cutouts 92, and a shorting bar 76.

Portions of the extrinsic semiconductor stripes 164 which are not covered with the data lines 171 and the drain electrodes 175 are removed by etching to complete a plurality of ohmic contact stripes 161 including a plurality of projections 163 and a plurality of ohmic contact islands 165, and to expose portions of the intrinsic semiconductor stripes 151. Oxygen plasma treatment may follow thereafter in order to stabilize the exposed surfaces of the semiconductor stripes 151.

Figure 11:
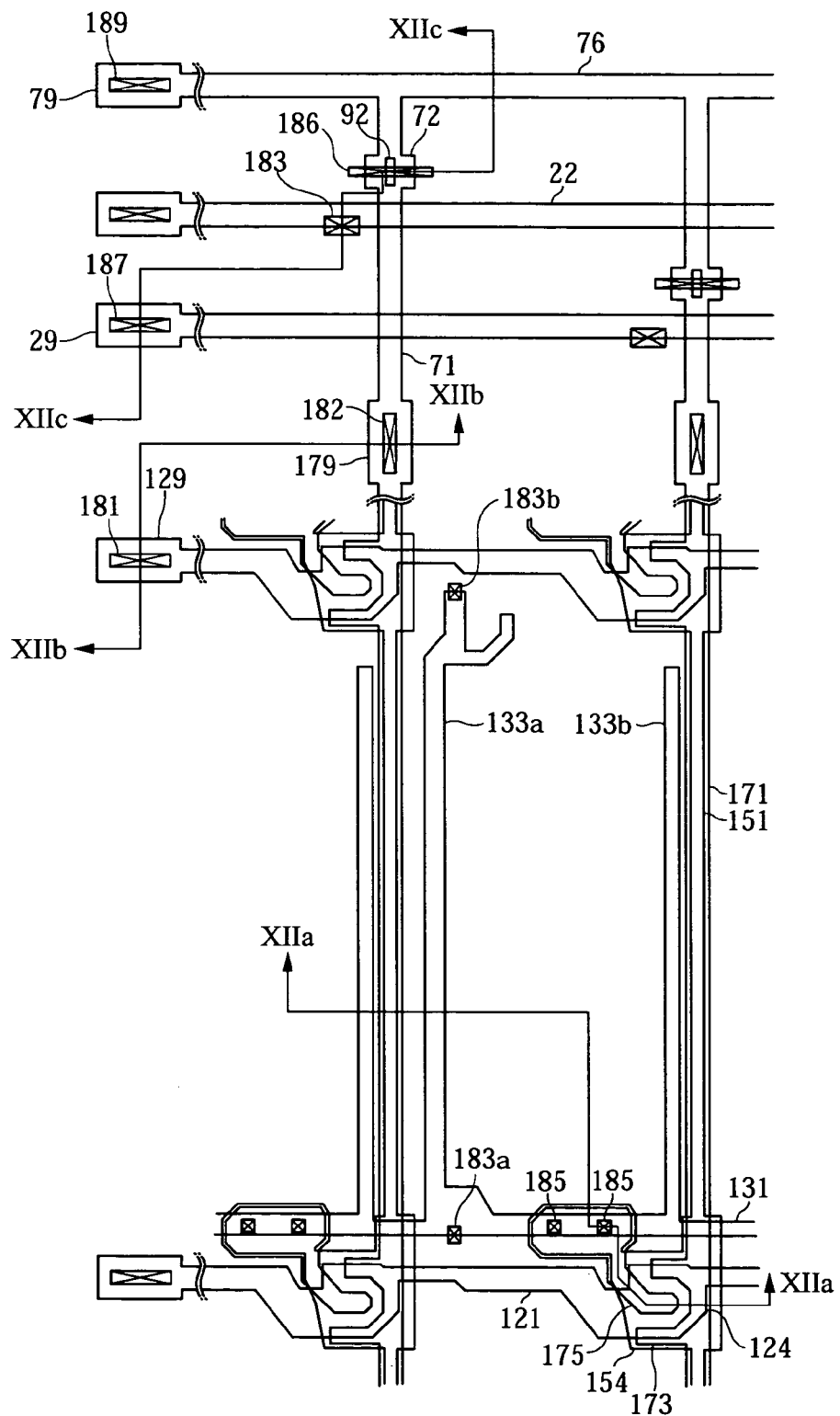
Figure 12A:
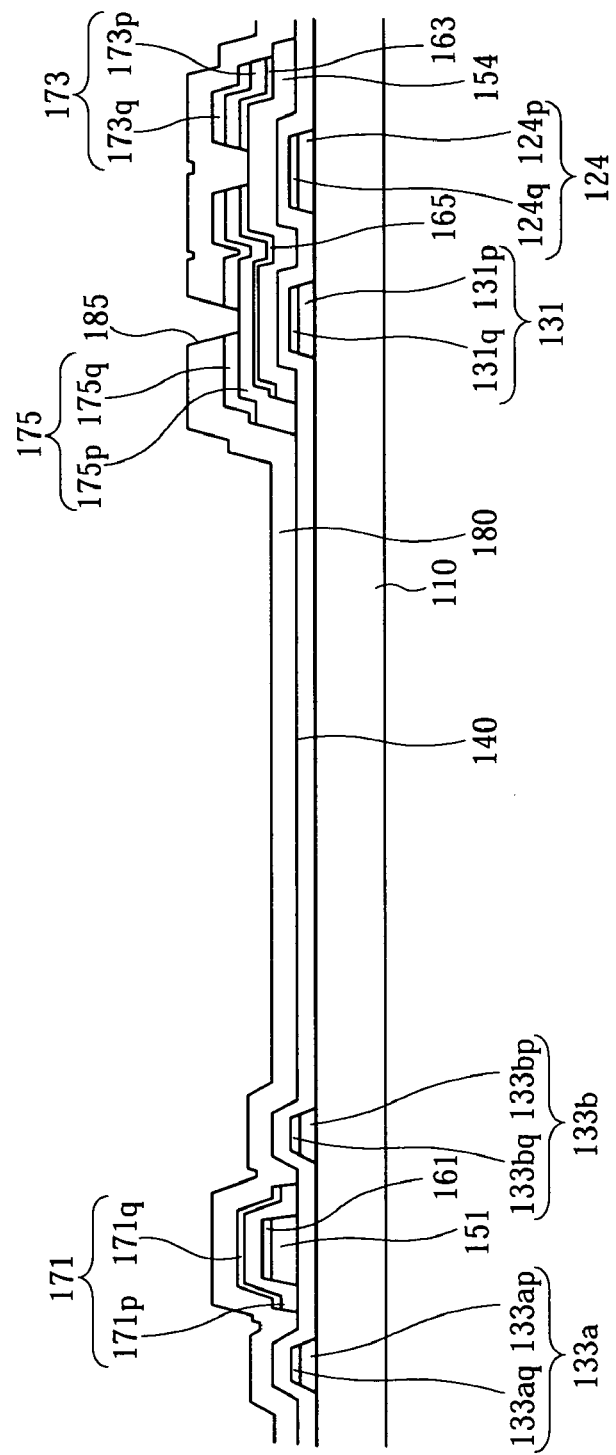
FIGS. 12A and 12B are sectional views of the TFT array panel shown in FIG. 11 taken along the lines XIIA-XIIA and XIIB-XIIB.
Figure 12B:
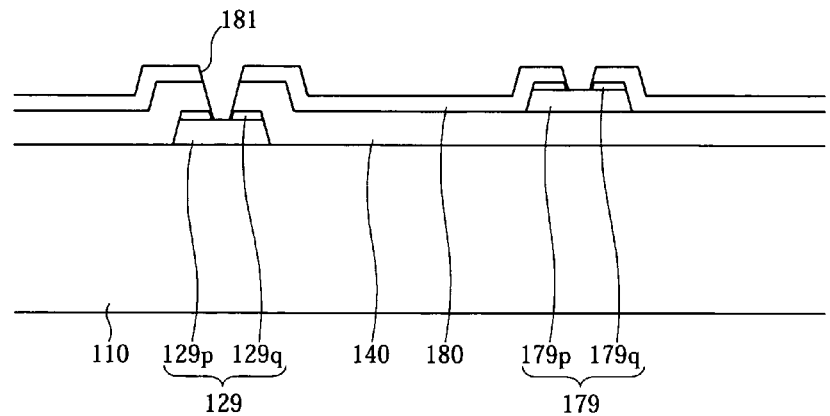

As shown in FIGS. 11 to 12B, a passivation layer 180 preferably made of an inorganic insulating material such as silicon nitride is deposited on the data lines 171, the drain electrodes 175, and the exposed semiconductor stripes 151.

Thereafter, the passivation layer 180 and the gate insulating layer 140 are photo-etched to form a plurality of contact holes 181, 182, 185, and 189 exposing the lower layers 175p, 129p, and 179p of the drain electrodes 175, and the end portions 129, 179, and 79 of the gate lines 121, the data lines 171 and the shorting bar 76; a plurality of contact holes 183a exposing portions of the storage electrode lines 131 near the fixed end portions of the storage electrodes 133b; and a plurality of contact holes 183b exposing the linear branches of the free end portions of the storage electrodes 133b.

At this time, a plurality of contact holes 184 and 187 respectively exposing lower layers 22p and 29p of the portion of the first test lines 22 and the end portion 29, and a plurality of contact holes 186 exposing the expansion portion 72 of the second test lines 71 are formed, and will be described in detail with reference to FIGS. 12C to 12F.

Figure 12C:
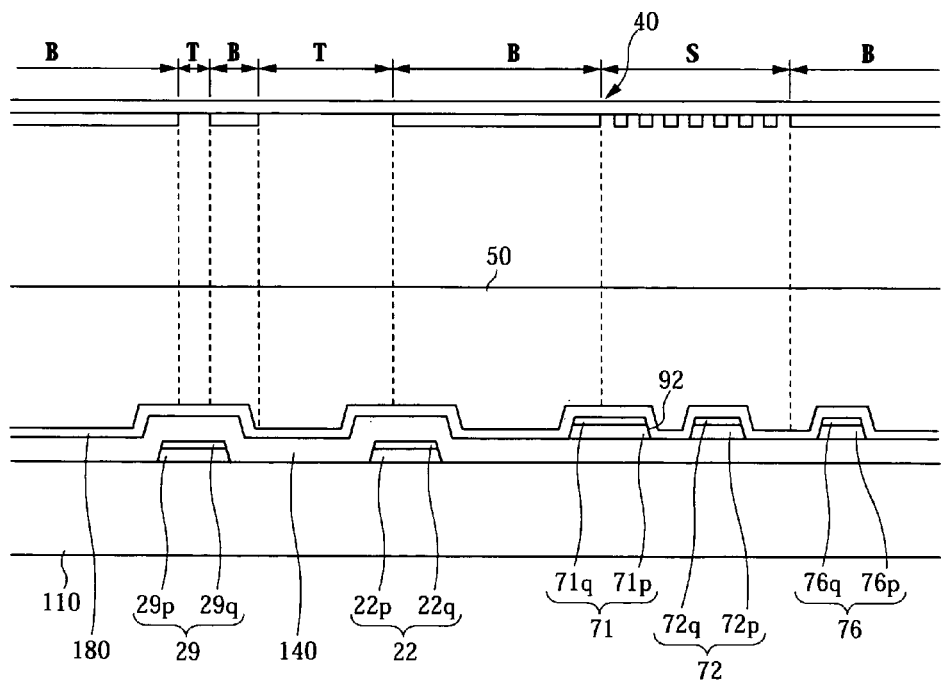
FIGS. 12C to 12F are sectional views of the TFT array panel shown in FIG. 11 taken along the line XIIC-XIIC in intermediate steps of a manufacturing method thereof according to an embodiment of the present invention.

As shown in FIG. 12C, the passivation layer 180 is deposited on the gate insulating layer 140, and on the second test line 71 and the shorting bar 76, and positive photoresist 50 is coated on the passivation layer 180. Subsequently, an exposure mask 40 is aligned thereon.

The exposure mask 40 includes translucent areas S corresponding to the area including the expansion portion 72 of the second test line 71, transparent areas T corresponding to the end portion 29 of the first test line 22 and the portion of the first test line 22 adjacent to the expansion 72, and light blocking opaque areas B corresponding to the remaining area.

Figure 12D:
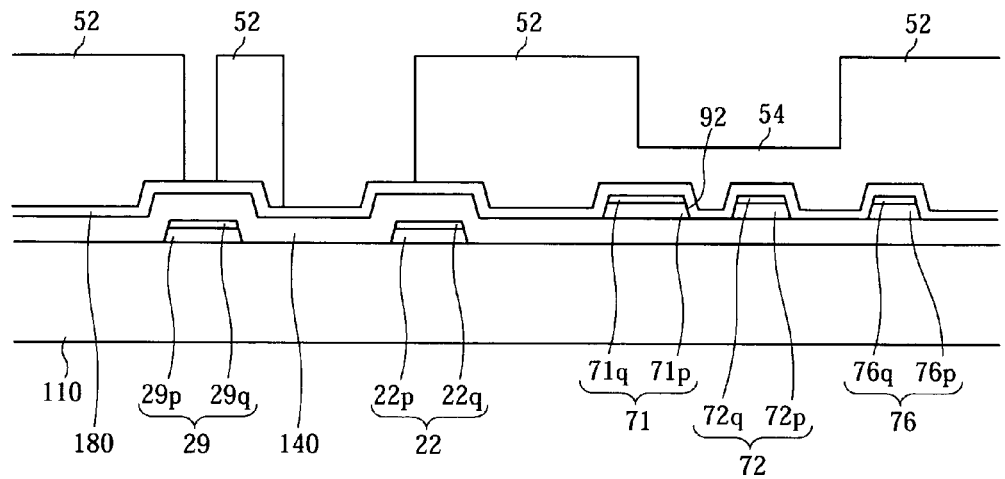

The photoresist 50 is exposed to light through exposure mask 40, and is developed so that the developed photoresist has a position-dependent thickness. The photoresist includes a plurality of first to third portions with decreased thickness. As shown in FIG. 12D, the first portions 52 are located on the majority of the area shown, and the second portions 54 are located on the area including the expansion portion 72 of the second test line 71. No reference numeral is assigned to the third portions located on the end portion 29 of the first test line 22 and the portion of the first test line 22 adjacent to the expansion 72, since they have substantially zero thickness.

Figure 12E:
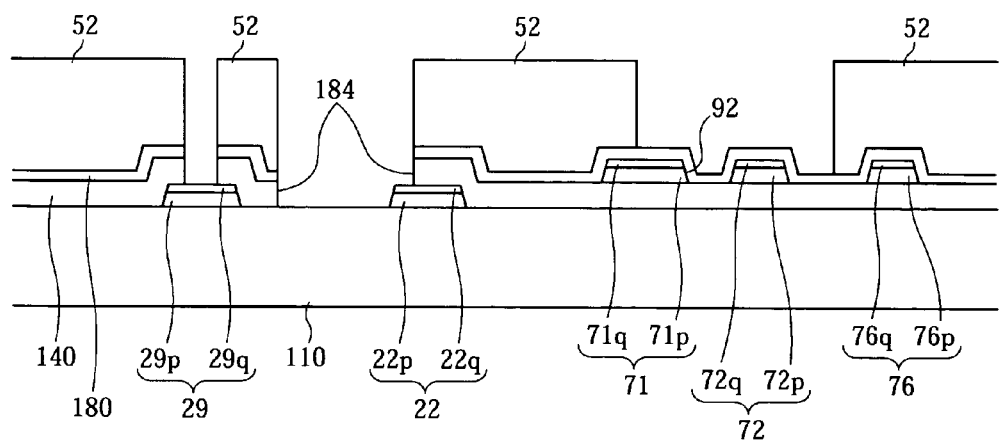

Next, as shown in FIG. 12E, the exposed portions of the passivation layer 180 and the gate insulating layer 140 are etched to form a plurality of contact holes 184 and 187 respectively exposing the upper layers 22q and 29q of the first test line 22 and the end portion 29. Next, the portion of the photoresist 54 is removed by ashing, and the thickness of the photoresist 52 is decreased.

Figure 12F:
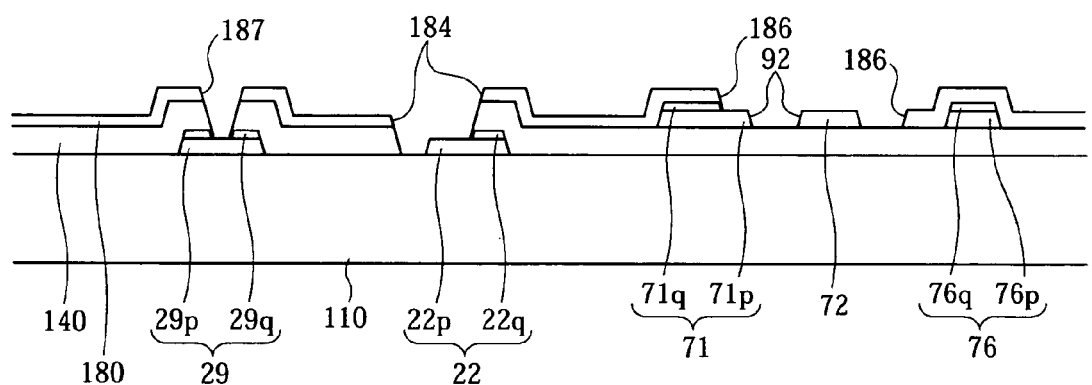

Next, as shown in FIG. 12F, the exposed portions of the upper layers 22q and 29q of the first test line 22 and the end portion 29 is wet-etched to expose the portion of the lower layers 22p and 29p of the first test line 22 and the end portion 29. The passivation layer 180 and the upper layers 71q and 72q of the second test line 71 and the expansion 72 are then etched to form a plurality of contact holes 186 exposing the lower layer 71p of the second test line 71. At this time, the upper layer 72q of the expansion 72 is wet-etched, and only the lower layer 72p is left. Since only the lower layer remains, the reference "p" of the lower layer 72p of the expansion 72 is omitted in FIG. 12F.

Here, only one contact hole 186 corresponding to the expansion 72 is shown in FIG. 12F, but a plurality of contact holes 186 may be formed with slit shapes of uniform interval.

Finally, IZO or ITO is sputtered and etched to form a plurality of pixel electrodes 191, a plurality of contact assistants 81, 82, 87, and 89, and a plurality of connecting assistants 84 and overpasses 83 on the passivation layer 180.

As described above, the upper layers 22q, 29q, and 71q comprising aluminum are wet-etched. Because the wet-etch is generally isotropic, the upper layers 22q, 29q, and 71q under the insulating layers 140 and 180 are etched out due to the lateral etch such that the undercuts are generated, and the undercut portions in FIGS. 2, 3, 4, and 12f are indicated with thick lines.

For existing array test configurations, the undercuts reduce the cross-sectional area of the current carriers, increasing the resistance. When an array test using a large electric current is performed in the manufacturing process, the increased resistance produces a large amount of resistive heating (proportional to the resistance times the square of the current), and the Cr layer or the Al layers of the first and second test lines 22 and 71 are melted or burned. Accordingly, disconnections of signal lines such as the test lines are generated, and the array test is abnormally executed.

However, the current systems and techniques reduce or eliminate signal line disconnections. The expansions 72 of the second test line 71 connected to the first test line 22 through the connecting assistants 84 are divided into the plurality of portions with respect to the cutouts 92, so that the electric current path and the contact areas are increased for the array test. Accordingly, although the undercut is generated, the expansions 72 and the cutouts 92 substantially prevent the first and second test lines 22 and 71 from melting or burning. Therefore, the disconnections of the first and second test lines may be minimized, resulting in a stable and reliable an array test.

As above-described, the expansions are added in the areas adjacent to the intersecting regions of the first and second test lines, so the melting or burning problems due to the narrow electric current path because of the undercut may be minimized. Accordingly, an array test with stability and reliability may be achieved.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film panel comprising:
   a first signal line;
   a second signal line crossing the first signal line and formed on a different layer from the first signal line, wherein the second signal line includes a divided portion that is divided into at least two portions, and wherein the divided portion is adjacent to a crossing region where the second signal line crosses the first signal line;
   a first insulating layer formed between the first signal line and the second signal line;
   a second insulating layer formed on the second signal line, wherein the second insulating layer has at least one first contact hole exposing a portion of the divided portion of the second signal line; and
   a connector assistant formed adjacent to the crossing region;
   wherein the second signal line is electrically connected to the first signal line through the connector assistant; and
   wherein the first and second insulating layers have a second contact hole exposing a portion of the first signal line, and the connector assistant electrically connects the first signal line to the second signal line through the first and second contact holes.

2. The thin film panel of claim 1, wherein the second signal line comprises a first layer and a second layer, and wherein the portion of the expansion of the second signal line exposed through the first contact hole comprises the first layer of the second signal line.

3. The thin film panel of claim 2, wherein the first insulating layer is exposed through the divided portion.

4. The thin film panel of claim 3, wherein the first signal line and the second signal line each comprise a first layer and a second layer, and wherein the first layers of each of the first and second signal lines comprises chromium or a chromium alloy.

5. The thin film panel of claim 4, wherein the second layer of each of the first and second signal lines comprises aluminum or an aluminum alloy.

6. The thin film panel of claim 1, further comprising:
   a shorting bar connected to the second signal line.

7. The thin film panel of claim 1, further comprising:
   a gate line to transmit gate signals; and
   a data line to transmit data signals,
   wherein the gate line is formed in the same layer as the first signal line and the data line is formed in the same layer as the second signal line.

8. The thin film panel of claim 1, wherein the divided portion of the second signal line is electrically connected to the first signal line through the connector assistant.

9. The thin film panel of claim 1, wherein the first insulating layer is exposed through the divided portion.

10. The thin film panel of claim 6, further comprising:
    a gate line to transmit sate signals; and
    a data line to transmit data signals,
    wherein the gate line is formed in the same layer as the first signal line and the data line is formed in the same layer as the second signal line.

11. A thin film panel comprising:
    a first signal line;
    a second signal line crossing the first signal line and formed on a different layer from the first signal line, wherein the second signal line includes an expansion, the expansion has an enlarged area and at least one cutout, and the expansion is disposed adjacent to a crossing region where the second signal line crosses the first signal line;
    a first insulating layer formed between the first signal line and the second signal line; and
    a second insulating layer formed on the second signal line, wherein the second insulating layer has at least one first contact hole exposing a portion of the expansion of the second signal line; and
    a connector assistant formed adjacent to the crossing region,
    wherein the second signal line is electrically connected to the first signal line using the connector assistant, and wherein the first and second insulating layers have a second contact hole exposing a portion of the first signal line and the connector assistant electrically connects the first signal line to the second signal line through the first and second contact holes.

12. The thin film panel of claim 11, wherein the second signal line comprises a first layer and a second layer, and wherein the portion of the expansion of the second signal line exposed through the first contact hole comprises the first layer of the second signal line.

13. The thin film panel of claim 12, wherein the first insulating layer is exposed through the at least one cutout of the expansion.

14. The thin film panel of claim 13, wherein the first signal line and the second signal line each comprise a first layer and a second layer, and wherein the first layers of each of the first and second signal lines comprises chromium or a chromium alloy.

15. The thin film panel of claim 14, wherein the second layer of each of the first and second signal lines comprises aluminum or an aluminum alloy.

16. The thin film panel of claim 11, wherein the first insulating layer is exposed through the at least one cutout of the expansion.

17. The thin film panel of claim 11, further comprising:
    a gate line to transmit gate signals; and
    a data line to transmit data signals,
    wherein the gate line is formed in the same layer as the first signal line and the data line is formed in the same layer as the second signal line.

18. The thin film panel of claim 11, further comprising:
a shorting bar connected to the second signal line.

19. The thin film panel of claim 18, further comprising:
a gate line to transmit gate signals; and
a data line to transmit data signals,
wherein the gate line is formed in the same layer as the first signal line and the data line is formed in the same layer as the second signal line.

* * * * *